(12) United States Patent
Lim

(10) Patent No.: US 7,116,138 B2
(45) Date of Patent: Oct. 3, 2006

(54) RAMP SIGNAL GENERATION CIRCUIT

(75) Inventor: Su-hun Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/045,043

(22) Filed: Jan. 31, 2005

(65) Prior Publication Data

US 2005/0168251 A1   Aug. 4, 2005

(30) Foreign Application Priority Data

Jan. 30, 2004  (KR) .................. 10-2004-0006121

(51) Int. Cl.
*H03M 1/10* (2006.01)
(52) U.S. Cl. ..................... 327/131; 327/137
(58) Field of Classification Search ......... 327/131–133
See application file for complete search history.

(56) References Cited

U.S. PATENT DOCUMENTS 6,384,645 B1 *  5/2002  Brambilla et al. .......... 327/137

6,388,505 B1 *  5/2002  Ribellino et al. ........... 327/536

FOREIGN PATENT DOCUMENTS

JP       2001-203936       7/2001
KR   1020030050089 A       6/2003

* cited by examiner

*Primary Examiner*—Dinh T. Le
(74) *Attorney, Agent, or Firm*—Volentine Francos & Whitt, PLLC

(57) ABSTRACT

A ramp signal generation circuit is disclosed. The ramp signal generation circuit comprises a ramp signal generator, a buffer, a comparator, and a switching circuit. The switching circuit provides current to an output of the ramp signal generation circuit in response to a control signal output by the comparator. When a high slew rate is required, the output of the ramp signal generation circuit is driven by the current provided by the switching circuit. Otherwise, the output of the ramp signal generation circuit is driven by an output of the buffer.

15 Claims, 5 Drawing Sheets

RAMP SIGNAL GENERATION CIRCUIT

BACKGROUND OF THE INVENTION

1. Field of the Invention

The present invention relates generally to a ramp signal generation circuit, and more particularly, to a ramp signal generation circuit incorporated in a complementary metal-oxide-semiconductor (CMOS) image sensor.

A claim of priority is made to Korean Patent Application No. 2004-6121, filed Jan. 30, 2004, the disclosure of which is incorporated herein by reference in its entirety.

2. Description of the Related Art

A CMOS image sensor (CIS) typically operates at a lower voltage than a charge-coupled device (CCD), has lower power consumption, can be manufactured more efficiently by a employing standard CMOS fabrication process, and allows other processes to be readily integrated on the CMOS chip along with the image sensor. For at least these reasons, it is expected that CISs will take the place of CCDs in many imaging devices in the future.

Unlike a CCD, however, a CIS requires a high resolution Analog-to-Digital Converter (ADC) to convert analog signals output by an Active Pixel Sensor (APS) into digital signals.

At least two methods exist for converting analog signals into digital signals in a CIS. One common method uses a single ADC while another method uses a column ADC. The method that uses a single ADC converts analog signals output by several columns of APS units into digital signals in a predetermined time interval, using a single ADC operating at a high speed. Accordingly, the surface area required to mount the ADC on a semiconductor chip is small. However, the CIS power consumption is relatively high since the single ADC typically operates at a high speed.

In the method using the column ADC, a single ADC having a relatively simple structure is typically allocated for each APS unit. The resulting CIS power consumption is lower than in the foregoing approach, but the chip area occupied by the ADCs is relatively large. In a CIS using a column ADC, one unit block of the image sensor (i.e. a block corresponding to a single pixel) comprises a ramp signal generation circuit and a comparator. Any attempt to simultaneously address the issues of performance, size, and power consumption by emerging CIS structures necessarily implicates the design and performance of the ramp signal generation circuit and comparator.

SUMMARY OF THE INVENTION

The present invention provides a ramp signal generation circuit having low power consumption and a high slew rate.

According to one aspect of the present invention, a ramp signal generation circuit comprises a ramp signal generator, a buffer, a comparator, and a switching circuit. The ramp signal generation circuit provides a ramp signal. The buffer receives the ramp signal and a feedback output from itself. The output of the buffer is connected to an output of the ramp signal generation circuit. The comparator receives the output of the buffer and the ramp signal and provides a control signal. The switching circuit receives the control signal and provides current from a power source to the output of the ramp signal generation circuit depending on the voltage level of the control signal. The power source preferably has a power supply voltage or a ground voltage.

BRIEF DESCRIPTION OF THE DRAWINGS

The accompanying drawings illustrate several preferred embodiments of the present invention and are incorporated in and constitute a part of this specification. In the drawings.

DETAILED DESCRIPTION OF THE INVENTION

Figure 1:
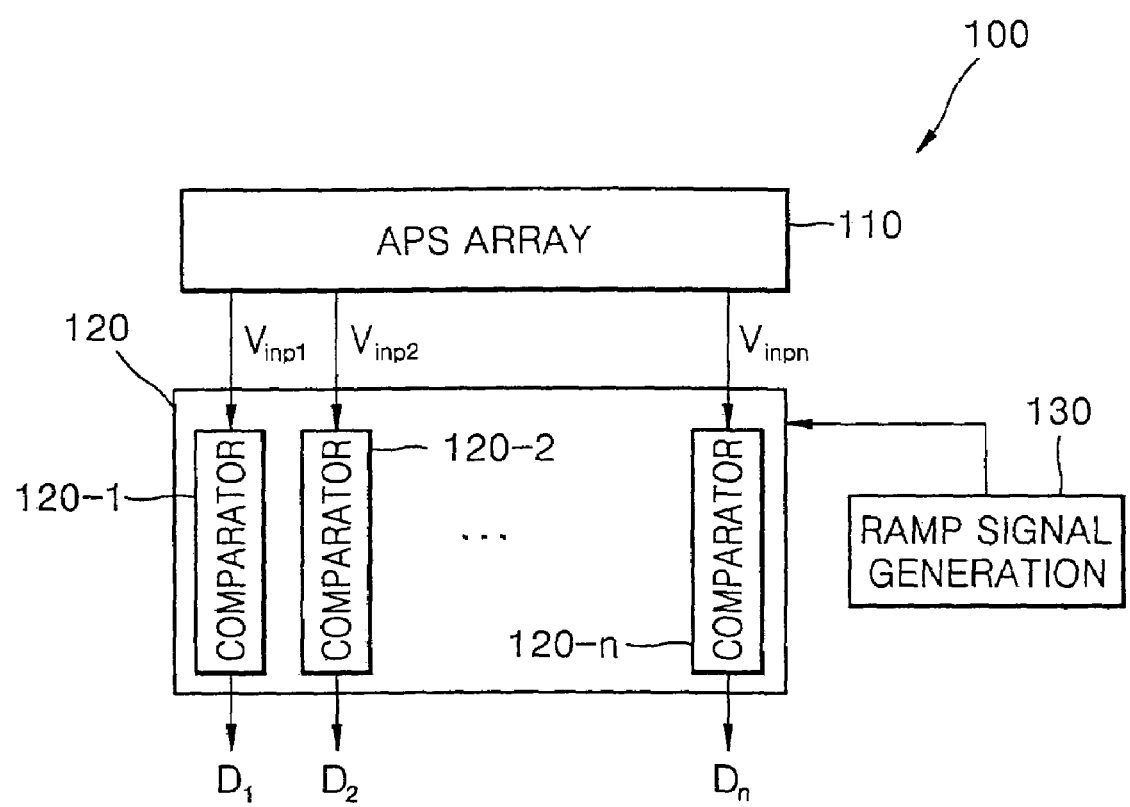
FIG. 1 shows a portion of a CMOS image sensor including a conventional ramp signal generation circuit.

The present invention will now be described more fully with reference to the accompanying drawings, in which several embodiments of the present invention are shown. In the drawings, like reference numerals refer to like elements.

FIG. 1 shows a portion of an exemplary CMOS image sensor comprising a single ramp signal generation circuit 130. Referring to FIG. 1, a portion 100 of the CMOS image sensor comprises an APS array 110, a comparator array 120 and a ramp signal generation circuit 130. APS array 110 comprises a plurality of active pixels or APS units. Comparator array 120 comprises comparators 120-1 through 120-n corresponding to columns in APS array 110. Ramp signal generation circuit 130 generates a ramp signal and applies the ramp signal to the plurality of comparators 120-1 through 120-n within comparator array 120.

Each of comparators 120-1 through 120-n receives a signal $V_{inpx}$, where "x" is a natural number between 1 and n, output by a corresponding column in APS array 110. Each of comparators 120-1 through 120-n also receives the ramp signal output by the ramp signal generation circuit. Each of comparators 120-1 through 120-n performs correlated double sampling of the received signals and generates a digital signal as the sampled result. The resulting digital signals are labelled $D_1$ through $D_n$. Accordingly, each comparator 120-1 through 120-n acts as an ADC.

Portion 100 of the CMOS image sensor preferably further comprises a buffer for storing digital signals $D_1$ through $D_n$.

Figure 2:
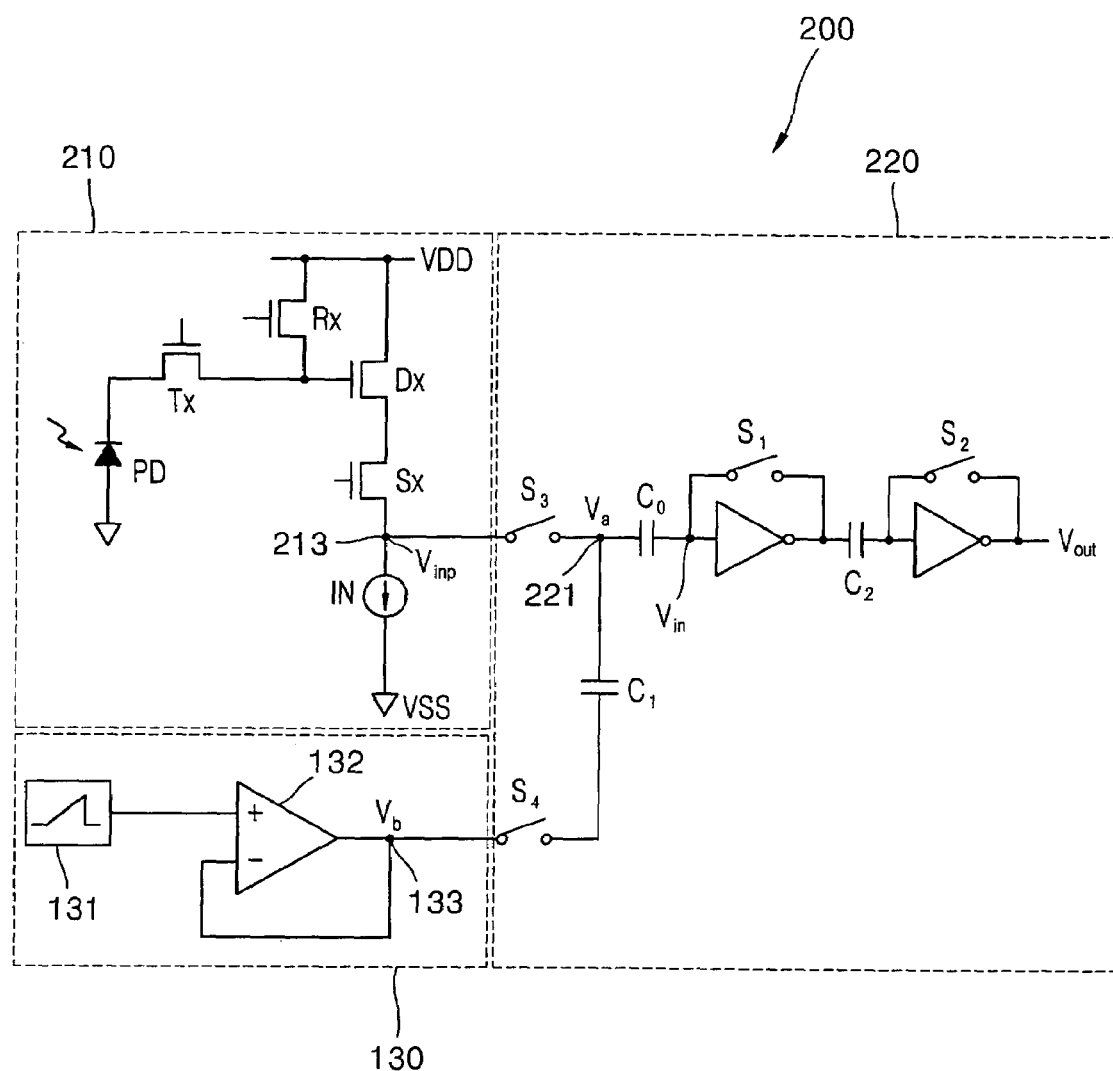
FIG. 2 is a circuit diagram showing a unit block of an image sensor. The unit block converts an analog signal output by an active pixel sensor unit into a digital signal.

FIG. 2 is a circuit diagram showing a unit block of an image sensor. The unit block converts an analog signal output by an APS unit into a digital signal. Referring to FIG. 2, a unit block 200 of an image sensor comprises an APS unit 210, a comparator 220 and ramp signal generation circuit 130.

APS unit 210 comprises a photo diode PD, a plurality of transistors Tx, Rx, Dx and Sx, and a current source IN. Photo diode PD generates a voltage corresponding to the strength of an external light source. A transmission transistor Tx transfers the voltage generated by photo diode PD to a gate of a source-follower transistor Dx. A reset transistor Rx applies a reset voltage to the gate of source-follower transistor Dx. A selection transistor Sx applies a voltage generated by source-follower transistor Dx to a node 213. Current source IN is connected between node 213 and a power source VSS having a ground voltage. APS unit 210 supplies an output signal $V_{inp}$ at node 213.

Ramp signal generation circuit 130 comprises a ramp signal generator 131 and a buffer amplifier 132. Ramp signal generator 131 generates an analog ramp voltage. Buffer amplifier 132 receives and buffers the ramp voltage in order to apply the ramp voltage to several comparators as seen, for example, in FIG. 1. Buffer amplifier 132 supplies a buffer output signal $V_b$ at an output node 133.

The number of comparators connected to output node 133 is about 640 in a CIS providing video graphics array (VGA) resolution and about 1280 in a CIS providing super extended graphics array (SXGA) resolution. Accordingly, buffer amplifier 132 must have a large enough driving capability to drive all of the comparators connected to ramp signal generator 131.

Buffer amplifier 132 is often serially connected with a second buffer amplifier in order to increase the driving capability of ramp signal generation circuit 130. A buffer amplifier circuit having this structure is called a two-stage buffer amplifier. When a two-stage buffer amplifier is used, the gain of the two-stage buffer amplifier is preferably the unitary value 1.

Exemplary comparator 220 comprises first and second inverters, a plurality of switches $S_1$ through $S_4$, and a plurality of capacitors $C_0$, $C_1$ and $C_2$. Comparator 220 receives output signal $V_{inp}$ from APS unit 210 and buffer output signal $V_b$ from ramp signal generation circuit 130. Comparator 220 performs correlated double sampling on the received signals, and generates a digital signal $V_{out}$ as the sampled result. Accordingly, comparator 220 acts as an analog-to-digital converter.

Figure 3:
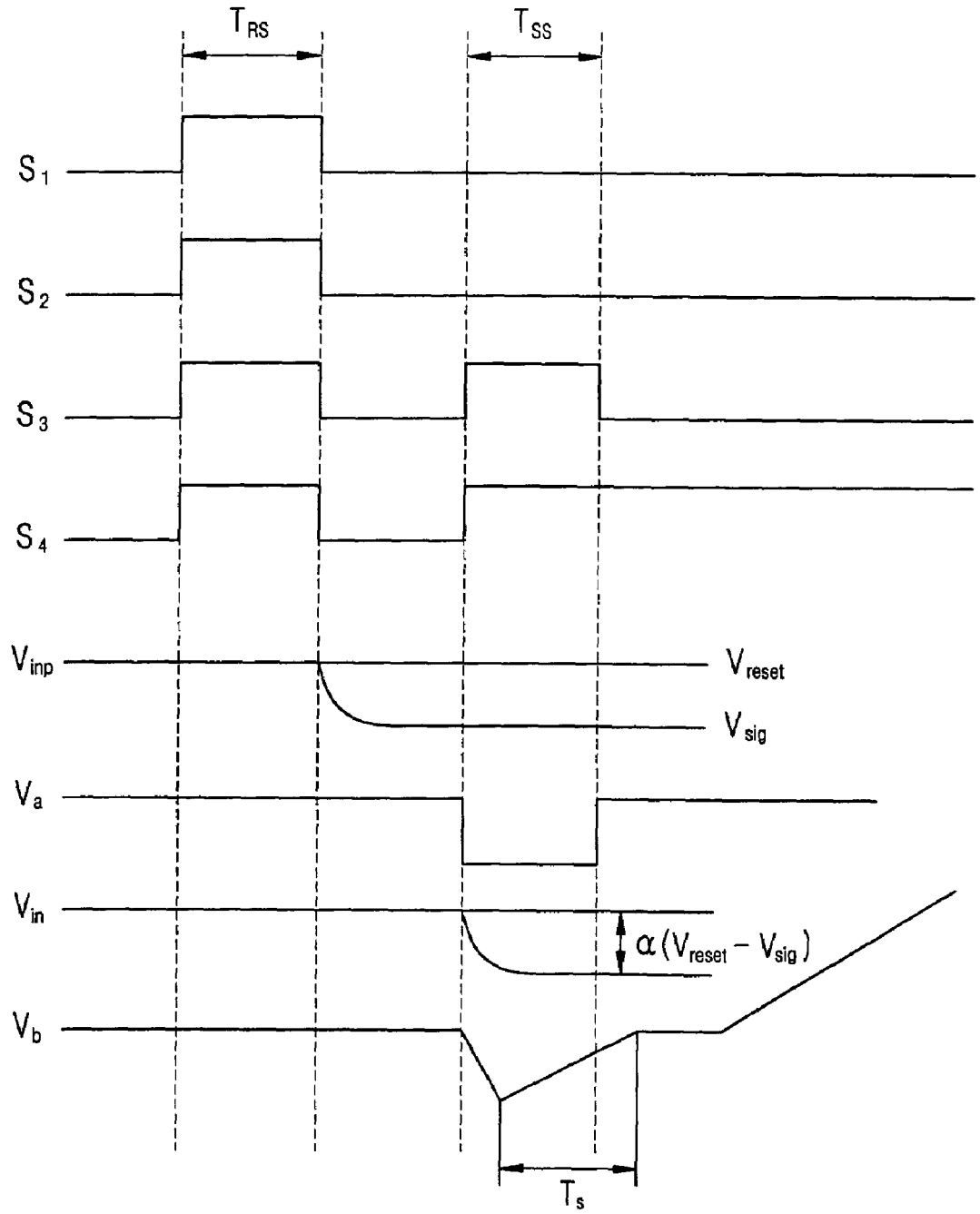
FIG. 3 is a waveform timing diagram showing voltage waveforms for various signals in the unit block shown in FIG. 2.

FIG. 3 is a waveform timing diagram showing voltage waveforms for various signals in unit block 200 shown in FIG. 2. The waveforms are described as follows.

In FIG. 3, $T_{RS}$ is a reset sampling interval and $T_{SS}$ is a signal sampling interval. In reset sampling interval $T_{RS}$, output signal $V_{inp}$ of APS unit 210 is maintained at a reset voltage level $V_{reset}$. However, in signal sampling interval $T_{SS}$, output signal $V_{inp}$ of APS unit 210 is reduced to a signal voltage level $V_{sig}$. When the strength of an external light source increases, a signal $V_a$ apparent at a node 221 is significantly reduced, which in turn greatly reduces buffer output signal $V_b$ at output node 133 due to a coupling of nodes 221 and 133 by capacitor $C_1$.

Referring to FIGS. 1 and 2, since the single ramp signal generation circuit 130 is generally connected to a plurality of comparators like those of exemplary comparator 220, the capacitance apparent at output node 133 is the sum of the capacitances $C_1$ for the plurality of capacitors.

Due to the overall capacitance apparent at output node 133, a significant time interval $T_s$ is required to restore the voltage level of buffer output signal $V_b$ at output node 133. Time Ts is referred to as a settling time.

Where the two-stage buffer amplifier is used, the driving capability of ramp signal generation circuit 130 increases, thereby reducing settling time Ts. However, due to an overall capacitance apparent at an output node of the two-stage buffer amplifier, a frequency response of the image sensor is unstable. Furthermore, a voltage at the output node of the two-stage buffer amplifier is sensitive to power line noise.

Due to these problems, the performance of the single ramp signal generator in a CIS deteriorates as the resolution of the CIS increases.

Where a single buffer amplifier 132 is used in the ramp signal generation circuit, the instability of the frequency response and the sensitivity of the output voltage to power line noise are relatively low; however, it is necessary to increase the current driving capability of buffer amplifier 132 in order to reduce settling time Ts. Unfortunately, increasing the driving capability of buffer amplifier 132 increases the power consumption of ramp signal generator 131.

In order to successfully address at least these problems, the present invention provides a ramp signal generation circuit comprising a single buffer amplifier. The ramp signal generation circuit of the present invention minimizes the power consumption of the ramp signal generator while reducing settling time $T_s$.

Figure 4:
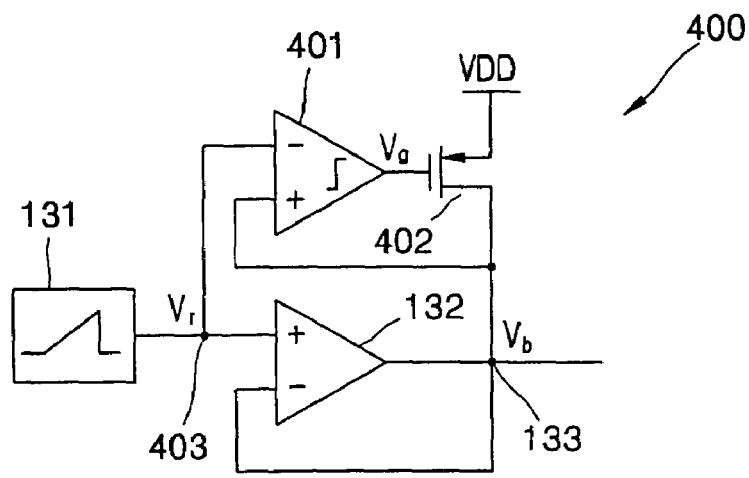
FIG. 4 is a circuit diagram of a ramp signal generation circuit according to one aspect of the present invention.

FIG. 4 shows a ramp signal generation circuit according to one presently preferred embodiment of the present invention. Referring to FIG. 4, a ramp signal generation circuit 400 comprises a ramp signal generator 131, a buffer 132, a comparator 401, and a switching circuit 402.

Ramp signal generator 131 generates a ramp signal and outputs the ramp signal on an output terminal 403. Buffer 132 has a first input terminal, a second input terminal, and an output terminal 133. The first input terminal of buffer 132 is connected to output terminal 403 of ramp signal generator 131 and the second input terminal of buffer 132 is connected to output terminal 133.

Comparator 401 has a first input terminal, a second input terminal, and an output terminal providing a comparator output signal $V_g$. The first input terminal of comparator 401 is connected to output node 133, the second input terminal of comparator 401 is connected to output terminal 403, and the output terminal of comparator 401 is connected to a control terminal of switching circuit 402.

Switching circuit 402 is connected between a power source VDD having a power supply voltage and output node 133. Switching circuit 402 performs switching in response to comparator output signal $V_g$. Switching circuit 402 is typically implemented using a positive-channel metal oxide semiconductor (PMOS) transistor supplying current generated by power source VDD to output node 133 of buffer 132 in response to comparator output signal $V_g$, which is received on the gate of the PMOS transistor. The gate of the PMOS transistor is typically connected to the control, terminal of switching circuit 402.

Figure 5:
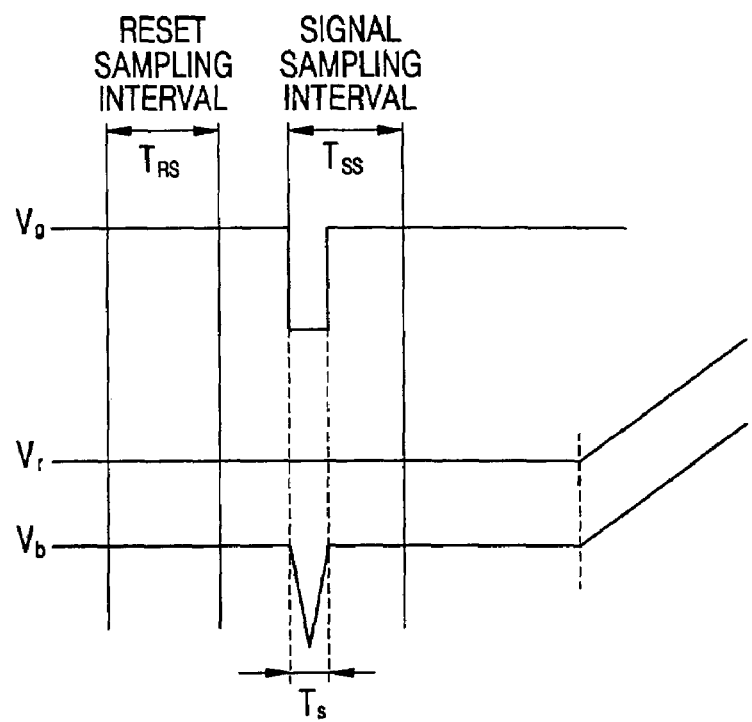
FIG. 5 is a waveform timing diagram showing voltage waveforms for various signals in the ramp signal generation circuit shown in FIG. 4.

FIG. 5 is a waveform timing diagram showing voltage waveforms of several signals in ramp signal generation circuit 400 shown in FIG. 4. The waveforms illustrate the operation of ramp signal generation circuit 400.

In FIG. 5, $T_{RS}$ is a reset sampling interval and $T_{SS}$ is a signal sampling interval. Referring to comparator 220 and APS unit 210 in FIG. 2 and ramp signal generation unit 400 in FIG. 4, during signal sampling interval $T_{SS}$, increasing the strength of an external light source significantly reduces output voltage $V_{inp}$ of APS unit 210. Accordingly, a voltage level of signal $V_a$ at node 221 is significantly reduced. As a result, the voltage level of buffer output signal $V_b$ at output node 133 is also significantly reduced due to coupling between output node 133 and APS unit 210 by capacitor $C_1$.

A voltage level for a signal $V_r$ at output terminal 403 of ramp signal generator 131 remains constant. Thus, the voltage level of buffer output signal $V_b$ at the first input terminal of comparator 401 becomes lower than the voltage level at the second input terminal of comparator 401. As a result, the voltage level of comparator output signal $V_g$ becomes 0V. Accordingly, PMOS transistor 402 is turned on and the voltage level of buffer output signal $V_b$ at the first input terminal of comparator 401 increases to the voltage level of power source VDD.

Where a voltage difference $V_r-V_b$ between the first and second input terminals of comparator 401 is smaller than an offset voltage of comparator 401 due to the increase in the voltage level of buffer output signal $V_b$ at the first input terminal, the voltage level of comparator output signal $V_g$ increases to the voltage level of power source VDD. Accordingly, the PMOS transistor corresponding to switching circuit 402 is turned off and the voltage level of buffer output signal $V_b$ increases according to the voltage level of signal $V_r$.

The offset voltage of comparator 401 is generated by a size mismatch between paired transistors in comparator 401. Accordingly, whenever the voltage level of buffer output signal $V_b$ approaches the voltage level of signal $V_r$, the offset voltage of comparator 401 maintains the voltage level of comparator output signal $V_g$ at the voltage level of power source VDD, thereby turning off switching circuit 402.

Therefore, the ramp signal generation circuit according to the present invention reduces the settling time $T_s$ of buffer output signal $V_b$ using a single buffer 132. Also, since ramp signal generation circuit 400 only supplies current to output terminal 133 through switching circuit 402 when a great slew rate is required, power consumption associated with the ramp signal generation circuit is generally reduced.

Figure 6:
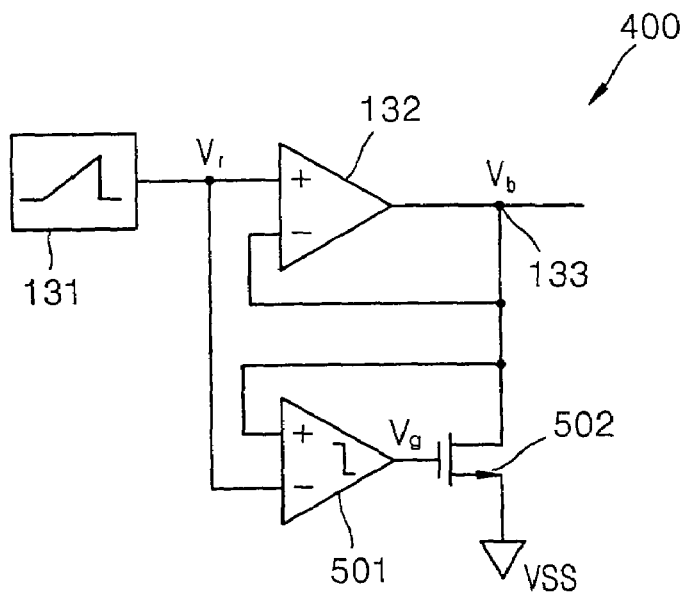
FIG. 6 is a circuit diagram of a ramp signal generation circuit according to another aspect of the present invention; and, FIG. 7 is a circuit diagram of a ramp signal generation circuit according to still another aspect of the present invention.

FIG. 6 is a circuit diagram of a ramp signal generation circuit 400 according to another exemplary embodiment of the present invention. Ramp signal generation circuit 400 shown in FIG. 6 provides an improved negative slew rate. Ramp signal generation circuit 400 preferably comprises a ramp signal generator 131, a buffer 132, a comparator 501, and a switching circuit 502.

Ramp signal generator 131 generates a ramp signal and has an output terminal carrying the ramp signal. Buffer 132 has a first input terminal, a second input terminal, and an output terminal 133. The first input terminal of buffer 132 is connected to the output terminal of ramp signal generator 131 and the second input terminal of buffer 132 is connected to output terminal 133 of buffer 132.

Comparator 501 has a first input terminal, a second input terminal, and an output terminal carrying a comparator output signal $V_g$. The first input terminal of comparator 501 is connected to output terminal 133 of buffer 132, the second input terminal of comparator 501 is connected to the output terminal of ramp signal generator 131, and the output terminal of comparator 501 is connected to a control terminal of switching circuit 502.

Switching circuit 502 is connected between power source VSS and output terminal 133 of buffer 132 and performs switching in response to a voltage level of comparator output signal $V_g$.

Switching circuit 502 is preferably implemented using a negative-channel metal oxide semiconductor (NMOS) transistor, wherein the NMOS transistor connects output terminal 133 of buffer 132 to power source VSS in response to the voltage level of comparator output signal $V_g$ received through at gate of the NMOS transistor.

Figure 7:
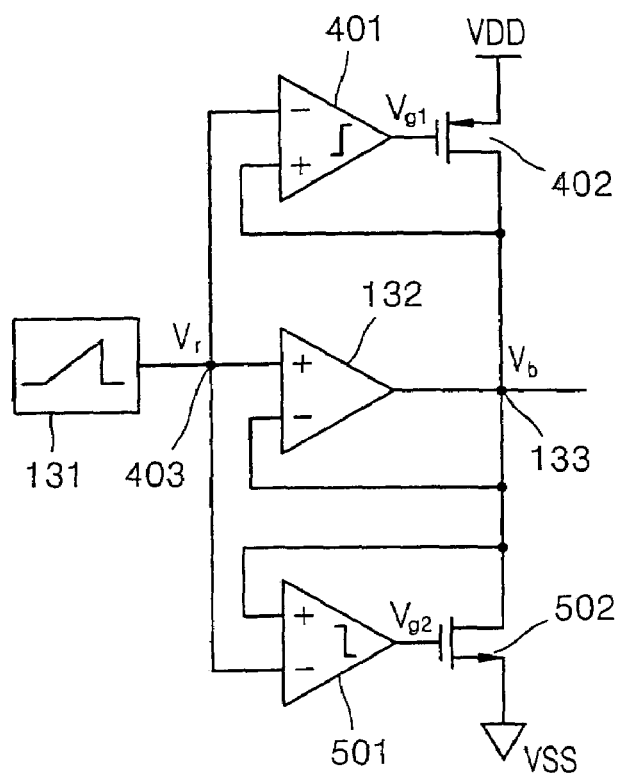

FIG. 7 is a circuit diagram of a ramp signal generation circuit according to still another exemplary embodiment of the present invention. The ramp signal generation circuit shown in FIG. 7 provides improved positive and negative slew rates.

Referring to FIG. 7, a ramp signal generation circuit preferably comprises a ramp signal generator 131, a buffer 132, a first comparator 401, a second comparator 501, a first switching circuit 402, and a second switching circuit 502.

Ramp signal generator 131 has an output terminal 403 carrying a ramp signal. Buffer 132 has a first input terminal, a second input terminal, and an output terminal 133. The first input terminal of buffer 132 is connected to output terminal 403 of ramp signal generator 131 and the second input terminal of buffer 132 is connected to output terminal 133 of buffer 132.

First comparator 401 has a first input terminal, a second input terminal and an output terminal. The first input terminal of first comparator 401 is connected to output terminal 133 of buffer 132, the second input terminal of first comparator 401 is connected to output terminal 403 of ramp signal generator 131, and the output terminal of first comparator 401 is connected to a control terminal of first switching circuit 402.

First switching circuit 402 is connected between a power source VDD and output terminal 133 of buffer 132 and performs switching in response to a voltage level of a first comparator output signal $V_{g1}$ apparent at the control terminal of switching circuit 402. First switching circuit 402 is preferably implemented using a PMOS transistor supplying current generated by power source VDD to output terminal 133 of buffer 132 in response to a voltage level of comparator output signal $V_{g1}$. The control terminal for switching circuit 402 is preferably connected to the gate of the PMOS transistor.

Second comparator 501 has a first input terminal, a second input terminal, and an output terminal. The first input terminal of second comparator 501 is connected to output terminal 133 of buffer 132, the second input terminal of second comparator 501 is connected to output terminal 403 of ramp signal generator 131, and the output terminal of the second comparator 501 is connected to a control terminal of second switching circuit 502.

Second switching circuit 502 is connected between a power source VSS and output terminal 133 of buffer 132 and performs switching in response to a voltage level of a second comparator output signal $V_{g2}$ apparent at the control terminal of second switching circuit 502.

Second switching circuit 502 is preferably implemented using a NMOS transistor connecting output terminal 133 of buffer 132 to power source VSS in response to the voltage level of second comparator output signal $V_{g2}$. The control terminal of second switching circuit 502 is preferably connected to the gate of the NMOS transistor.

In summary, a ramp signal generation circuit according to the present invention reduces the settling time $T_s$ for an output voltage of a buffer even where a single buffer is used. Furthermore, since the ramp signal generation circuit only supplies current to an output terminal of the buffer through a switching circuit when a large slew rate is required, the power consumed by the ramp signal generation circuit is significantly reduced.

The preferred embodiments disclosed in the drawings and the corresponding written description are teaching examples. Those of ordinary skill in the art will understand that various changes in form and details may be made to the exemplary embodiments without departing from the scope of the present invention which is defined by the following claims.

What is claimed is:

1. A ramp signal generation circuit comprising:
a ramp signal generator generating a ramp signal;

a buffer receiving and buffering the ramp signal, wherein the buffer comprises an output terminal providing a buffer output signal;

a first comparator receiving the ramp signal and the buffer output signal, comparing the ramp signal and the buffer output signal, and outputting a first comparator output signal in accordance with the comparison; and, a first switching circuit disposed between a first power source and the output terminal, and response to the first comparator output signal.

2. The ramp signal generation circuit of claim 1, wherein, the buffer further comprises a first input terminal and a second input terminal;

the first comparator further comprises a first input terminal, a second input terminal, and an output terminal; and, the first switching circuit further comprises a control terminal;

wherein the first input terminal of the buffer is connected to an output terminal of the ramp signal generator and the second input terminal of the buffer is connected to the output terminal of the buffer; and, wherein the first input terminal of the first comparator is connected to the output terminal of the buffer, the second input terminal of the first comparator is connected to the output terminal of the ramp signal generator, and the output terminal of the first comparator is connected to the control terminal of the first switching circuit.

3. The ramp signal generation circuit of claim 1, wherein the first power source provides a power supply voltage.

4. The ramp signal generation circuit of claim 1, wherein the power source voltage is a ground voltage.

5. The ramp signal generation circuit of claim 1, wherein the first switching circuit comprises either a positive metal oxide semiconductor (PMOS) transistor, or a negative metal oxide semiconductor (NMOS) transistor.

6. The ramp signal generation circuit of claim 1, wherein the first comparator has a predetermined input offset voltage.

7. The ramp signal generation circuit of claim 1, further comprising:

a second comparator receiving the ramp signal and the buffer output signal, comparing the ramp signal and the buffer output signal, and outputting a second comparator output signal in accordance with the comparison; and, a second switching circuit disposed between a second power source and the output terminal, and response to the second comparator output signal.

8. The ramp signal generation circuit of claim 7, wherein, the second comparator has a first input terminal, a second input terminal, and an output terminal; and, the second switching circuit has a control terminal;

wherein the first input terminal of the second comparator is connected to the output terminal of the buffer, the second input terminal of the second comparator is connected to the output terminal of the ramp signal generator, and the output terminal of the second comparator is connected to the control terminal of the second switching circuit.

9. A ramp signal generation circuit adapted for use within a CMOS image sensor, wherein the ramp signal generator is adapted to provide a buffer output signal at an output terminal, and comprises:

a ramp signal generator generating a ramp signal;

a buffer comprising the output terminal and adapted to receive and buffer the ramp signal;

a first comparator adapted to compare the ramp signal and the buffer output signal and output a first comparator output signal in accordance therewith; and, a first switching circuit disposed between a first power source and the output terminal, and response to the first comparator output signal.

10. The ramp signal generation circuit of claim 9, wherein, the buffer further comprises a first input terminal and a second input terminal;

the first comparator further comprises a first input terminal, a second input terminal, and an output terminal; and, the first switching circuit further comprises a control terminal;

wherein the first input terminal of the buffer is connected to an output terminal of the ramp signal generator and the second input terminal of the buffer is connected to the output terminal of the buffer; and, wherein the first input terminal of the first comparator is connected to the output terminal of the buffer, the second input terminal of the first comparator is connected to the output terminal of the ramp signal generator, and the output terminal of the first comparator is connected to the control terminal of the first switching circuit.

11. The ramp signal generation circuit of claim 9, wherein the first power source provides a power supply voltage.

12. The ramp signal generation circuit of claim 9, wherein the first switching circuit comprises either a positive metal oxide semiconductor (PMOS) transistor, or a negative metal oxide semiconductor (NMOS) transistor.

13. The ramp signal generation circuit of claim 9, wherein the first comparator has a predetermined input offset voltage.

14. The ramp signal generation circuit of claim 9, further comprising:

a second comparator adapted to compare the ramp signal and the buffer output signal and output a second comparator output signal in accordance therewith; and, a second switching circuit disposed between a second power source and the output terminal, and response to the second comparator output signal.

15. The ramp signal generation circuit of claim 14, wherein, the second comparator has a first input terminal, a second input terminal, and an output terminal; and, the second switching circuit has a control terminal;

wherein the first input terminal of the second comparator is connected to the output terminal of the buffer, the second input terminal of the second comparator is connected to the output terminal of the ramp signal generator, and the output terminal of the second comparator is connected to the control terminal of the second switching circuit.

* * * * *